United States Patent
Grant et al.

(10) Patent No.: US 6,551,922 B1
(45) Date of Patent: Apr. 22, 2003

(54) METHOD FOR MAKING A SEMICONDUCTOR DEVICE BY VARIABLE CHEMICAL MECHANICAL POLISH DOWNFORCE

(75) Inventors: John M. Grant, Austin, TX (US); Thomas S. Kobayashi, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/091,629

(22) Filed: Mar. 6, 2002

(51) Int. Cl.⁷ .......................................... H01L 21/4763
(52) U.S. Cl. ..................................... 438/633; 438/691
(58) Field of Search .................................. 438/633, 692, 438/693, 697, 700, 760, 691, 645

(56) References Cited

U.S. PATENT DOCUMENTS

| | | |
|---|---|---|
| 5,928,959 A | 7/1999 | Huckels et al. |
| 6,048,775 A | 4/2000 | Yao et al. |
| 6,057,207 A | 5/2000 | Lin et al. |
| 6,103,592 A | 8/2000 | Levy et al. |
| 6,146,975 A | 11/2000 | Kuehne et al. |
| 6,194,317 B1 * | 2/2001 | Kaisaki et al. |
| 6,365,523 B1 * | 4/2002 | Jang et al. |

FOREIGN PATENT DOCUMENTS

| | | |
|---|---|---|
| EP | 0 875 927 A2 | 4/1998 |
| EP | 0 905 755 A2 | 3/1999 |

* cited by examiner

*Primary Examiner*—David Nelms
*Assistant Examiner*—Phuc T. Dang
(74) *Attorney, Agent, or Firm*—Robert L. King; James L. Clingan, Jr.

(57) ABSTRACT

A semiconductor substrate has features extending above the surface. In one use, these features are gate stacks in which the gate is polysilicon to be replaced by metal. A dielectric is deposited over the substrate and the gate stacks having contours corresponding to the features. The desired structure prior to replacing the polysilicon gates is for the dielectric to be planar and even with the top of the gate stack. This is difficult to achieve with conventional CMP procedures because of varying polish rates based on the area and density of these features. The desired planarity is achieved by first depositing a conformal sacrificial layer. A CMP step using light downforce results in exposing and planarizing the underlying contours of the dielectric layer. A subsequent CMP step using higher downforce achieves the desired planar structure by providing a greater polish rate for the dielectric layer than for the sacrificial layer.

20 Claims, 3 Drawing Sheets

METHOD FOR MAKING A SEMICONDUCTOR DEVICE BY VARIABLE CHEMICAL MECHANICAL POLISH DOWNFORCE

FIELD OF THE INVENTION

This invention relates generally to semiconductors, and more specifically, to the formation of planar surfaces in semiconductor devices.

BACKGROUND OF THE INVENTION

A common requirement in semiconductor processing is the formation of structures that have a planar exposed surface. When surfaces are not planar, subsequent processing steps usually can be detrimentally affected. For example, when surfaces are not planar and a subsequent etch step is required, variable amounts of material are removed resulting in structures that are not desired. A common technique that is used to planarize a surface is the use of a chemical mechanical polish (CMP). The CMP process is a mechanical/chemical process that uses a rotating pad in conjunction with a slurry solution to physically remove material from an exposed device surface. Known CMP processes usually remove material for a pre-programmed time period or until an endpoint is optically detected. However, even the most sophisticated CMP processes do not evenly remove material from a surface. A common phenomenon is the dishing or erosion of portions of the surface so that the polished structure is uneven and non-planar.

Because the CMP process is imperfect, others have proposed the use of CMP with chemical etch steps. However, etch steps add cost and processing time to the manufacture of a semiconductor. Multiple manufacturing tools are, required to implement surface planarization when etching is required in combination with CMP. Further, CMP processing may have to be implemented both before and after the etching steps. Yet another planarization technique is the use of a planar fill layer overlying a nonplanar structure. The planar fill layer may be polished to a predetermined height that results in a planar upper surface. However, in forming the planar fill layer the device may be exposed to detrimentally high temperature to form the planar fill layer and the planar fill layer may itself have high defectivity.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
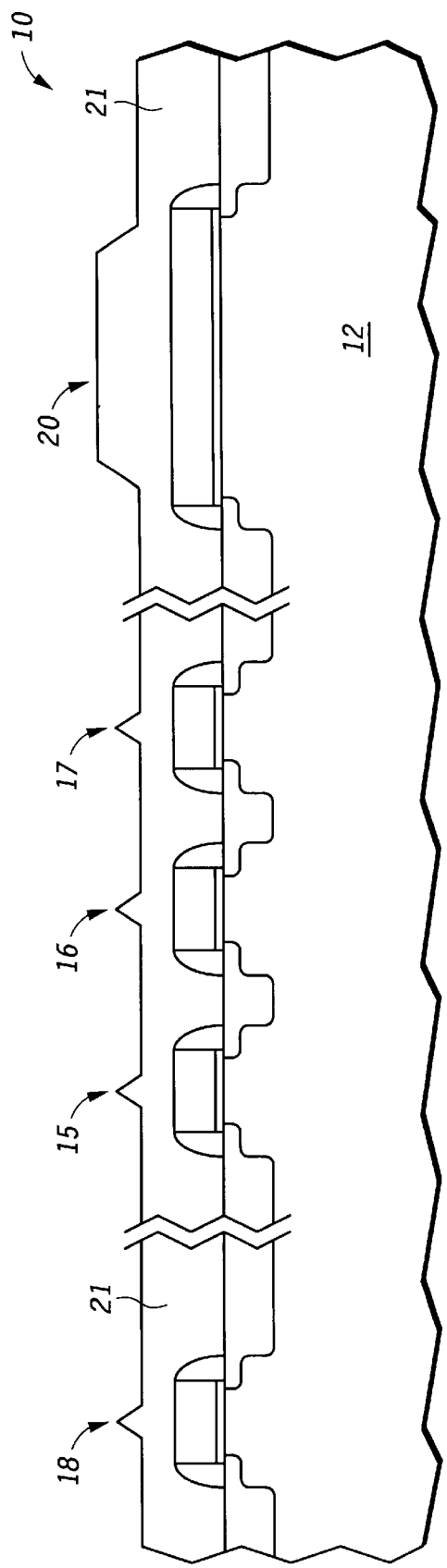
FIG. 1 illustrates in cross-sectional form a semiconductor device having a non-planar surface.

Illustrated in FIG. 1 is a semiconductor device 10 illustrating surface planarity issues typically encountered when processing a semiconductor. Within and above a substrate 12 is formed a plurality of features, such as features 15, 16 and 17 that are closely positioned and a feature 18 that is more remotely positioned. In one form, the features illustrated herein may be implemented as a plurality of transistor gate stacks because the features have semiconductor regions that are useful for having transistors formed therein. Additionally, a decoupling capacitor 20 is positioned separately from features 15, 16 and 17 as an example of an additional feature that is significantly larger in size than features 15, 16, 17 and 18. For example, feature 15 has a first area and decoupling capacitor 20 has a second area that is greater than the first area. Overlying features 15–18 and decoupling capacitor 20 is an interlevel dielectric layer 21 formed on a surface of the substrate 12 that is relatively planar only in certain areas. In one form, interlevel dielectric layer 21 is an insulating oxide. A common insulating oxide is silicon oxide and the thickness thereof is typically not greater than two thousand Angstroms. When interlevel dielectric layer 21 is formed overlying features 15–18 and decoupling capacitor 20, a nonplanar surface results. In particular, above each of the features 15–18 is a pointed contour resulting from deposition on the underlying features. For example, interlevel dielectric layer 21 has a first contour over feature 15, a first feature, and a second contour over decoupling capacitor 20, a second feature, where the second contour is higher above the surface of substrate 12 than the first contour. The nonplanarity results primarily from the fact that the interlevel dielectric layer 21 is formed over a nonplanar structure. For small features, the nonplanarity topography tends to be pointed when a planarizing deposition technique like high density plasma chemical vapor deposition (HDPCVD) is used.

Figure 2:
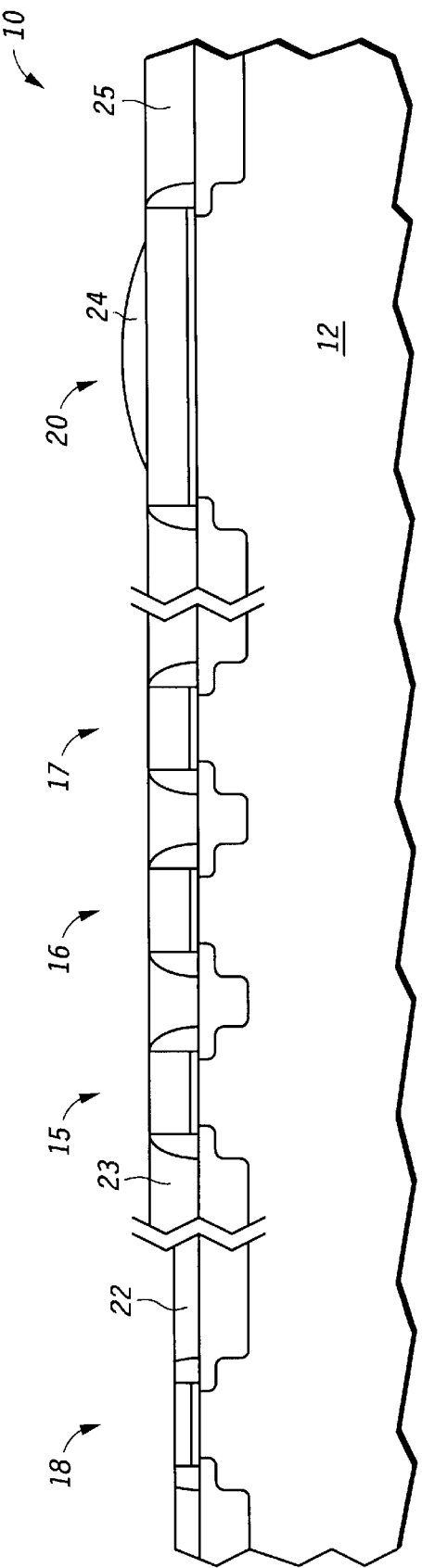
FIG. 2 illustrates in cross-sectional form the semiconductor device of FIG. 1 after a CMP step.

Illustrated in FIG. 2 is a subsequent cross-sectional view of semiconductor device 10 having the interlevel dielectric layer 21 partially removed using a CMP process to form dielectric regions 22, 23 and 25. However, due to imperfections associated with the CMP process, a portion 24 of dielectric layer 21 unintentionally remains lying above the decoupling capacitor 20. This portion is left because the region of interlevel dielectric layer 21 overlying decoupling capacitor 20 is elevated more than any other region of interlevel dielectric layer 21. As the elevated region is mechanically polished, the edges become rounded and smoothed into more of an elliptical shape. As a result, the polishing becomes less effective, thereby resulting in the portion 24.

Additionally, it should be noted that because feature 18 is physically removed from features 15–17 and is somewhat of an isolated structure, the CMP process tends to remove the interlevel dielectric layer 21 at a faster rate than removal of the interlevel dielectric layer 21 overlying features 15, 16 and 17. The result of this phenomenon is that a portion of feature 18 is actually unintentionally removed in the CMP process.

Figure 3:
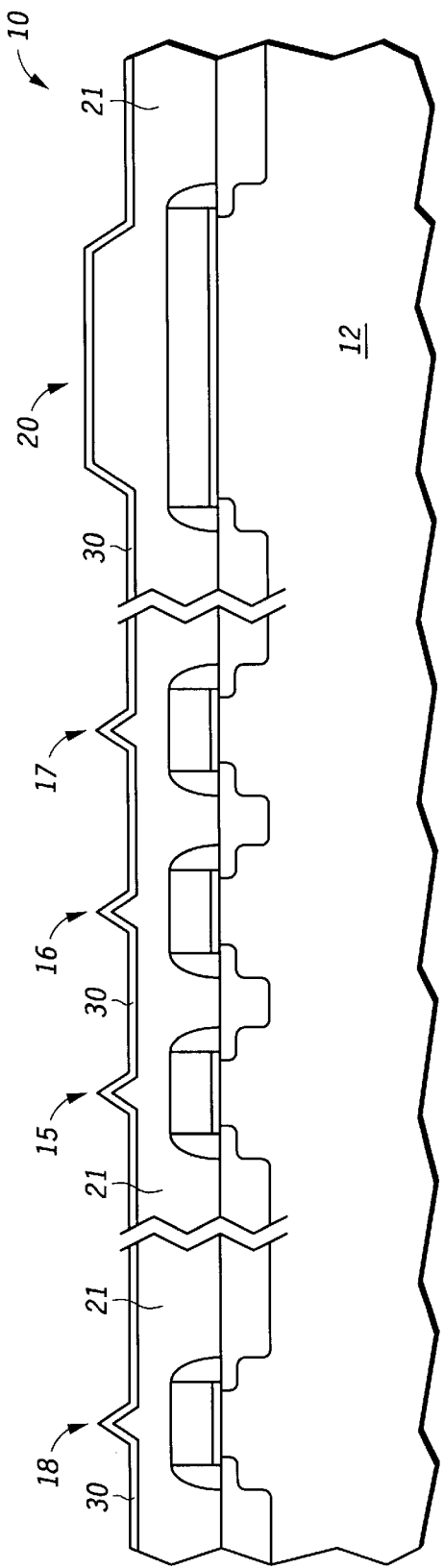
FIGS. 3–5 illustrate in cross-sectional form a semiconductor device processed in accordance with the present invention.

To overcome these disadvantages, illustrated in FIG. 3 is a cross section of device 10 prior to the above-described CMP processing of interlevel dielectric 21. For convenience of explanation, analogous elements between the figures will be identically numbered. A conformal sacrificial layer 30 is applied to semiconductor device 10. The conformal sacrificial layer 30 may be any material having a characteristic of polishing at a slower rate than the interlevel dielectric layer 21 and that can be used in the same polishing chemistry. In one form, the conformal sacrificial layer 30 is silicon nitride and polishes no greater than one-half as fast as the polish rate of the interlevel dielectric 21. Conformal sacrificial layer 30 may be applied by several methods such as deposition by a plasma enhanced CVD (PECVD) or by other CVD techniques. Since conformal sacrificial layer 30 is conformal, it should be noted that the portion of conformal sacrificial layer 30 above decoupling capacitor 20 is elevated from other areas of conformal sacrificial layer 30.

Figure 4:
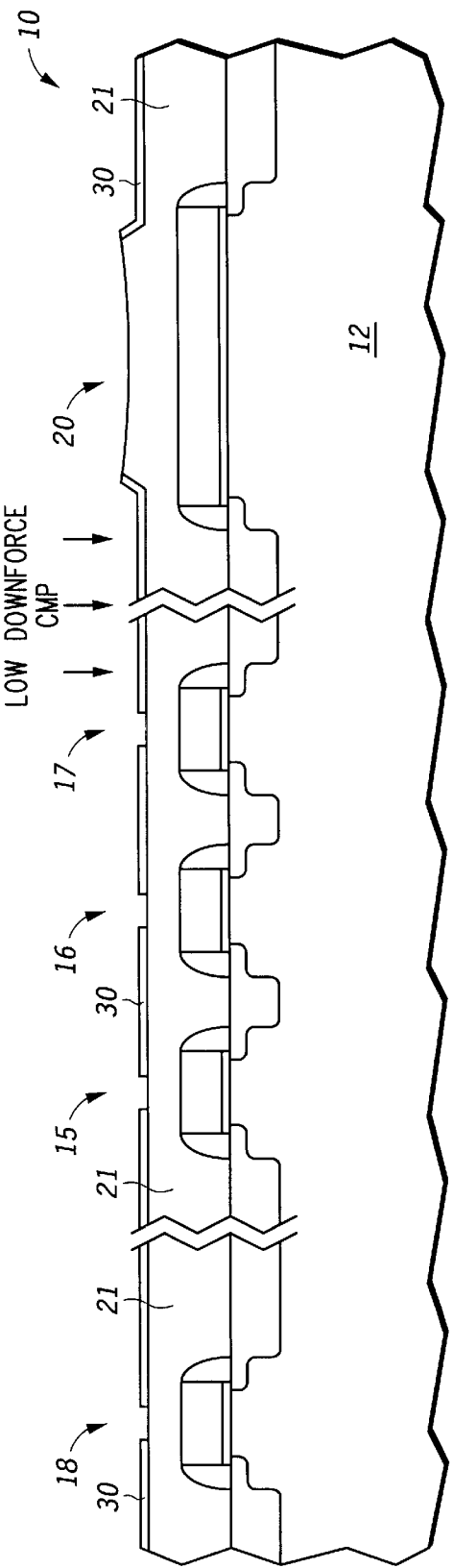

Illustrated in FIG. 4 is a cross-section of semiconductor device 10 wherein a first CMP step is applied. Polishing rates are variable depending upon several factors. A patterned wafer will polish at a faster rate than a non-patterned wafer given the same CMP parameters. Also, the material removal rate in a CMP process is modified by modifying the CMP downforce. As taught herein, different patterning rates can be effectively utilized to accomplish planarized surfaces from non-planar structures. Two CMP processes are used herein having differing downforce. Since the overall polish rate for the CMP process is determined by both the chemical and the mechanical component of the polish, it is desirable to have the first polish dominated by a chemical component and the second polish dominated by the mechanical component. A first CMP is a low downforce CMP process where the force is approximately in the range of 1–3 psi ($3.5 \times 10^{-3}$ MPa to $2.1 \times 10^{-2}$ MPa). The low downforce CMP process is further characterized by having a high platen speed so that the mechanical polishing has a small vertical component and a large horizontal component. As a result of using a low downforce, only the elevated portions of the conformal sacrificial layer 30 are opened, thereby allowing the polishing chemistry to work on the more susceptible under-layer. The high speed characteristic of the polishing places more force on the sides of elevated features and this force sheers the top portions of the elevated features. The CMP pad (not shown) operates with more of a horizontal energy force than a vertical energy force since there is less downward motion. The downforce used during this polishing step is, in one form, about one-third of the downforce used in a subsequent phase of the polishing to be described below and occurs at about two to three times the platen speed of the subsequent phase. During the first CMP, the CMP pad (not shown) is supported by the top of the conformal sacrificial layer 30. Further, as seen in FIG. 4, the conformal sacrificial layer 30 becomes substantially planar over features 15–18 but is removed by the polishing from the elevated upper surface of decoupling capacitor 20. Depending upon the length of polish time, an exposed portion of interlevel dielectric layer 21 overlying decoupling capacitor 20 remains slightly elevated from the remaining portions of the conformal sacrificial layer 30. Additionally, although feature 18 is physically separated from features 15–17, the height of conformal sacrificial layer 30 overlying feature 18 is substantially the same as the height of conformal sacrificial layer 30 overlying features 15–17. Because the downforce is low in the first CMP, the CMP process keeps the elevated surfaces of conformal sacrificial layer 30 planar.

Figure 5:
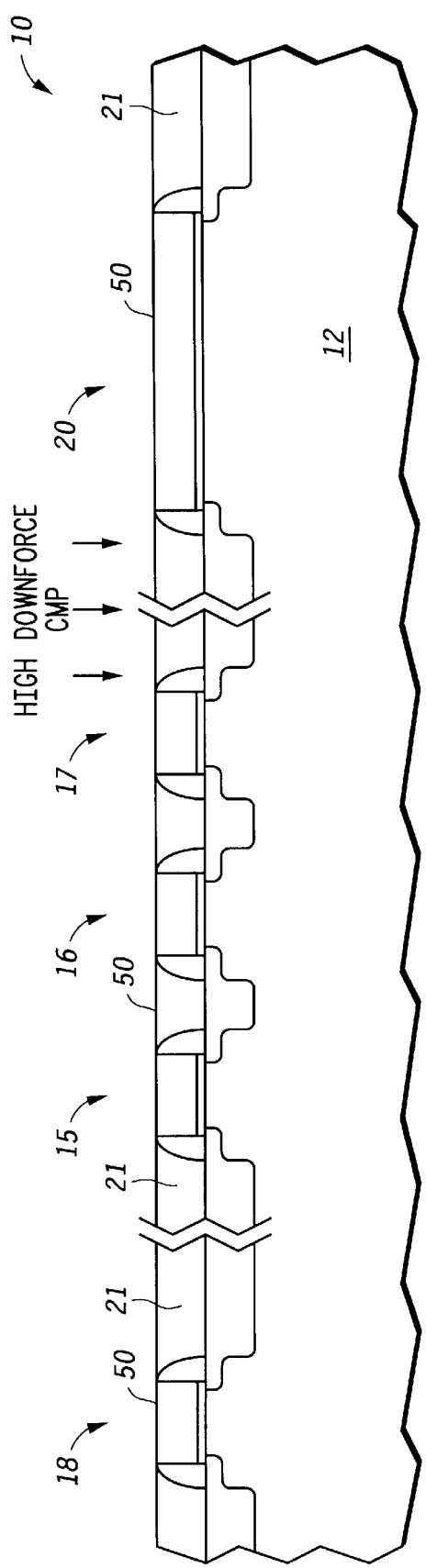

Illustrated in FIG. 5 is a cross-section of semiconductor device 10 wherein a second CMP step distinct from the first CMP step is performed. The second CMP step functions as a bulk removal process. In the second CMP step, a higher, second downforce is used to further planarize semiconductor device 10. The second CMP step or phase is also characterized by having a lower platen speed, about one-half to one-third the original platen speed, preferably. The mechanics of how CMP equipment may be operated to create different polishing rates is conventional and therefore will not be discussed here in detail. In one form, the higher downforce has a force in the range of approximately 5–10 psi ($3.5 \times 10^{-2}$ MPa (megapascals) to $6.9 \times 10^{-2}$ MPa). In one form, the rate of the second chemical mechanical polishing of interlevel dielectric 21 that was exposed during the low downforce polish is at least twice as fast as the rate for polishing the conformal sacrificial layer 30. It should be noted that with these ranges of force, the process taught herein is compatible with earlier versions of CMP equipment used in the semiconductor industry and does not necessarily require leading edge CMP equipment. The higher downforce begins polishing the entire exposed surface. The chemical action of the CMP process is not reduced from the first phase but the vertical mechanical action of the CMP process is increased. The mechanical action is increased sufficiently to dominate the difference in chemical etch rate. Therefore, the second phase of the CMP process will polish the exposed interlevel dielectric 21 over the decoupling capacitor 20 (see FIG. 4) at substantially the same rate as the other surfaces of device 10. As a result, these two regions will become coplanar with only the interlevel dielectric 21 present in each region. The chemical reaction of the CMP process will continue to polish the interlevel dielectric 21 in a planar manner. Because conformal sacrificial layer 30 is thin, it is removed relatively quickly and the CMP process functions to efficiently remove the planar single material, interlevel dielectric 21 at the higher downforce. The thickness of conformal sacrificial layer 30 may be any of various values, but is typically less than two hundred Angstroms. The high downforce CMP process stops in a conventional manner to leave an upper surface of features 15–18 and decoupling capacitor 20 exposed.

Use of two separate CMP steps, each having a different downforce is an important aspect in obtaining the desired upper surface planarity. The lower downforce that is initially used removes the relatively low polish rate conformal sacrificial layer 30 to expose the higher polish rate interlevel dielectric layer 21 only at elevated contours. An additional benefit of the lower downforce CMP step is that lower elevated areas of conformal sacrificial layer 30 will not be polished or removed. The higher downforce pressure will polish the interlevel dielectric 21 that is exposed only over the elevated contour by the lower downforce pressure at a higher polishing rate. The conformal sacrificial layer 30 will polish at a lower polishing rate, thereby reducing nonplanarity effects commonly referred to as "dishing".

At this point, a planar surface 50 of semiconductor device 10 has been provided. The planarity is accomplished without requiring any etching steps or etchants. Additional processing of semiconductor device 10 may be performed. In one application, assuming that features 15–18 implement transistors, the gate and gate dielectric materials thereof may be subsequently removed and replaced using any one of various known replacement gate processes.

By now it should be apparent that there has been provided a planarization method using a CMP having a ratio of differing downforces and differing pad speeds. The process initially uses a higher platen speed/lower downforce phase followed by a bulk removal phase having a lower platen speed/higher downforce. In one form the downforce ratio is approximately 1:3 and the speed ratio is 2–3:1. However, these ratios are by way of example only. Although the method taught herein has been disclosed with respect to certain specific steps and materials, it should be readily apparent that various alternatives may be used. For example, the planarization process may be implemented with semiconductor devices formed from CMOS devices, GaAs devices, bipolar devices and/or MRAM devices. The method taught herein may be used in connection with shallow trench isolation, replacement gate devices and for some metal interconnects, such as aluminum et al. The specific forces and dimensions provided herein are by way of example only and may be modified within the scope and spirit of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a semiconductor device, comprising:
    providing a semiconductor substrate having a surface and a plurality of features comprising semiconductor regions useful for forming transistors, the plurality of features extending above the surface;
    depositing a dielectric layer over the semiconductor substrate having a relatively planar surface with contours in the dielectric layer rising above the relatively planar surface over the plurality of features;
    depositing a sacrificial layer over the dielectric layer having contours in the sacrificial layer over the contours in the dielectric layer;
    chemical mechanical polishing the sacrificial layer with a first downforce to modify and planarize a portion of the countours of the dielectric layer; and
    chemical mechanical polishing the sacrificial layer and the dielectric layer with a second downforce greater than the first downforce until the sacrificial layer is removed and the plurality of features are exposed.

2. The method of claim 1 further comprising depositing the sacrificial layer conformal to the dielectric layer.

3. The method of claim 2 further comprising depositing silicon oxide as the dielectric layer and depositing silicon nitride as the sacrificial layer.

4. The method of claim 3, wherein chemical mechanical polishing the sacrificial layer and the dielectric layer comprises polishing silicon oxide at a rate that is least two times faster than that for polishing silicon nitride.

5. The method of claim 4 further comprising sizing the dielectric layer to have a thickness of not greater than two thousand Angstroms.

6. The method of claim 5 further comprising sizing the sacrificial layer to have a thickness of less than 200 Angstroms.

7. The method of claim 6 further comprising implementing the plurality of features as a plurality of transistor gate stacks.

8. The method of claim 1 further comprising using the first downforce to be not greater than 2.1 times 10 to the minus two megapascals, and implementing the second downforce to be not less than 3.5 times 10 to the minus two megapascals.

9. The method of claim 1 further comprising implementing at least one of the plurality of features as a capacitor.

10. A method for making a semiconductor device, comprising:
    providing a semiconductor substrate having a surface with a first feature above the surface having a first area and a second feature above the surface having a second area, wherein the second area is greater than the first area;
    depositing a dielectric layer over the semiconductor substrate having a first contour over the first feature and a second contour over the second feature, wherein the second contour is higher above the surface than the first contour;
    depositing a substantially conformal layer over the dielectric layer having a third contour over the first contour and a fourth contour over the second contour;
    chemical mechanical polishing the substantially conformal layer with a first downforce until the first contour and the second contour are exposed; and
    chemical mechanical polishing the substantially conformal layer and the dielectric layer with a second downforce greater than the first downforce.

11. The method of claim 10 further comprising providing the first feature as a gate stack and providing the second feature as a capacitor.

12. The method of claim 10 further comprising implementing the first downforce to be not greater than 2.1 times 10 to the minus two megapascals and implementing the second downforce to be not less than 3.5 times 10 to the minus two megapascals.

13. The method of claim 10 further comprising implementing the dielectric layer comprising silicon oxide and implementing the conformal layer comprising silicon nitride.

14. The method of claim 10 wherein the chemical mechanical polishing the conformal layer and the dielectric layer further comprises polishing silicon oxide faster than silicon nitride by at least a two to one ratio.

15. The method of claim 10 further comprising sizing the dielectric layer to have a thickness not greater than two thousand Angstroms and sizing the sacrificial layer to have a thickness not greater than 200 Angstroms.

16. The method of claim 10 wherein the chemical mechanical polishing the substantially conformal layer with a first downforce further comprises polishing the first contour and the second contour with the first downforce until the first contour is substantially planar with the substantially conformal layer and the second contour is polished to expose the dielectric layer.

17. A method for making a semiconductor device, comprising:
    providing a semiconductor substrate having a surface with a plurality of features above the surface;
    depositing a dielectric layer over the semiconductor substrate having contours over the plurality of features;
    depositing a substantially conformal sacrificial layer over the dielectric layer having contours over the contours of the dielectric layer;
    chemical mechanical polishing the substantially conformal sacrificial layer with a first downforce until a portion of the contours of the dielectric layer and the contours of the dielectric layer are substantially removed; and
    chemical mechanical polishing the substantially conformal sacrificial layer and the dielectric layer with a second downforce greater than the first downforce to expose the plurality of features at exposed surfaces that are substantially planar with the dielectric layer.

18. The method of claim 17 further comprising applying the first downforce to be not greater than 2.1 times 10 to the minus two megapascals and applying the second downforce to be not less than 3.5 times 10 to the minus two megapascals.

19. The method of claim 18 wherein chemical mechanical polishing the substantially conformal sacrificial layer and the dielectric layer further comprises polishing the dielectric layer at least twice as fast as the substantially conformal sacrificial layer.

20. The method of claim 19 further comprising sizing the dielectric layer to have a thickness not greater than two thousand Angstroms and sizing the substantially conformal sacrificial layer to have a thickness not greater than 200 Angstroms.

* * * * *